(12) United States Patent
Hussey

(10) Patent No.: US 6,541,853 B1
(45) Date of Patent: Apr. 1, 2003

(54) ELECTRICALLY CONDUCTIVE PATH THROUGH A DIELECTRIC MATERIAL

(75) Inventor: William Patrick Hussey, San Jose, CA (US)

(73) Assignee: Silicon Graphics, Inc., Mountain View, CA (US)

(*) Notice: Subject to any disclaimer, the term of this patent is extended or adjusted under 35 U.S.C. 154(b) by 0 days.

(21) Appl. No.: 09/391,133

(22) Filed: Sep. 7, 1999

(51) Int. Cl.$^7$ .............................. B32B 3/00; B32B 5/16; H05F 3/00; H01L 29/43; G08B 13/22

(52) U.S. Cl. ..................... 257/698; 257/700; 257/701; 257/758; 257/774; 257/775; 257/776; 257/789; 257/795; 257/773; 428/206; 428/195; 204/164

(58) Field of Search ................................ 257/698, 700, 257/701, 758, 741, 746, 778, 738, 734, 678, 687, 748, 750, 753, 773, 774, 775, 776, 789, 795; 428/206, 195, 212, 323, 327, 357; 204/164

(56) References Cited

U.S. PATENT DOCUMENTS

| | | | | |
|---|---|---|---|---|
| 3,653,741 A | * | 4/1972 | Marks | 350/147 |
| 4,281,043 A | * | 7/1981 | Deffeyes | 438/457 |
| 4,644,101 A | | 2/1987 | Jin et al. | 178/18 |
| 4,663,932 A | * | 5/1987 | Cox | 60/200 |
| 4,737,112 A | | 4/1988 | Jin et al. | 439/66 |
| 4,794,087 A | | 12/1988 | Despax et al. | 430/41 |
| 4,960,451 A | * | 10/1990 | Pettigrew et al. | 428/607 |
| 5,083,112 A | * | 1/1992 | Poitrewski et al. | 340/572 |
| 5,282,312 A | | 2/1994 | DiStefano et al. | 29/830 |
| 5,312,678 A | * | 5/1994 | McCullough, Jr. et al. | 428/225 |
| 5,316,857 A | * | 5/1994 | Spiegel | 428/457 |
| 5,352,517 A | * | 10/1994 | Clough et al. | 428/357 |
| 5,397,350 A | * | 3/1995 | Chow et al. | 623/4 |
| 5,698,839 A | * | 12/1997 | Jagielinski et al. | 235/493 |
| 5,744,223 A | | 4/1998 | Abersfelder et al. | 428/206 |
| 5,769,996 A | * | 6/1998 | McArdle et al. | 156/272.4 |
| 5,925,455 A | * | 7/1999 | Bruzzone et al. | 428/328 |
| 6,011,307 A | * | 1/2000 | Jiang et al. | 257/746 |
| 6,051,839 A | * | 4/2000 | Crewe | 250/396 ML |
| 6,180,318 B1 | * | 1/2001 | Fitzer et al. | 430/292 |
| 6,190,509 B1 | * | 2/2001 | Haba | 204/164 |
| 6,211,527 B1 | * | 4/2001 | Chandler | 250/492.2 |
| 6,376,393 B1 | | 4/2002 | Newton et al. | 438/783 |

FOREIGN PATENT DOCUMENTS

| | | | |
|---|---|---|---|
| DE | 299921058 U1 | * | 2/2000 |
| JP | 2000-13090 | * | 1/2000 |

* cited by examiner

Primary Examiner—Alexander O. Williams
(74) Attorney, Agent, or Firm—Schwegman, Lundberg, Woessner & Kluth, P.A.

(57) ABSTRACT

A structure and method thereof for providing an electrically conductive path between a first conductive point and a second conductive point. The structure includes an insulating material disposed between the first conductive point and the second conductive point. A dipole material is distributed within the insulating material. The dipole material is comprised of randomly oriented magnetic particles. The magnetic particles in a selected localized region of the insulating material are aligned to form an electrically conductive path between the first conductive point and the second conductive point through the insulating material.

28 Claims, 4 Drawing Sheets

ELECTRICALLY CONDUCTIVE PATH THROUGH A DIELECTRIC MATERIAL

TECHNICAL FIELD

The present invention pertains to the field of electrical systems. More specifically, the present invention pertains to a structure and method thereof for conducting electricity between devices, such as between conductive layers in a multilayer printed wiring board.

BACKGROUND ART

As is well known in the art, a packaged integrated circuit typically consists of an integrated circuit die encapsulated in a protective material such as ceramic or plastic. The packaged integrated circuit is attached to an underlying circuit board by soldering or using some type of electrical connector. The attachment mechanism is used to power and ground these devices as well as to pass address signals, data signals, control signals and other electrical signals from the integrated circuit package to the printed wiring board, enabling electrical signals to flow between various devices.

In one instance, multilayer printed wiring boards are used, where multiple conductive layers are laminated together, separated by an insulating material (e.g., a dielectric material). In the prior art, the signal path on one layer is continued on another layer using a drilled hole which has been metallized. These metallized drilled holes are commonly known as vias. In one type of connection, an electrical component is soldered to the surface of a printed wiring board containing etched traces. These traces provide an electrical path for signals. The trace proceeds along the circuit board and is connected to a via that, for example, is coated with a conductive material. The coated via extends into the internal structure of the printed wiring board where it may connect to an etched trace on an internal layer, forming a continuous electrical path on two or more layers. In another type of connection, the electrical connector of the device is electrically coupled directly to the via. In either case, the two devices are connected by an electrically conductive path using one or more vias and two or more layers.

In another instance, on a smaller scale that is analogous to the above, integrated circuit substrates in a device can be Layered one on top of another, separated by an insulating material. Vias can be used in a manner similar to the above to establish an electrically conductive path between layers of the substrate.

Prior Art FIG. 1 illustrates the use of vias with, for example, a plurality of layers containing electrically conductive paths that are laminated into a unified structure 150. Each layer (e.g., conductive layers 105) is separated from a neighboring layer by insulating layer 100. Insulating layer 100 is comprised of a dielectric material (polymers or various other materials known in the art). Conductive layers 105 and insulating layer 100 typify the conductive and insulating layers in structure 150.

Structure 150 includes vias 110, 120 and 130. Via 110 is a "blind via" extending from an external conductive layer through two insulating layers to an internal conductive layer. Via 120 is a blind via extending from an external conductive layer through one insulating layer to an internal conductive layer. Via 130 is a "buried via" connecting two internal conductive layers through an insulating layer.

A frequently used type of prior art electrical connector is a ball grid array (BGA). In a BGA connector, a plurality of electrically conductive balls are used to transfer electrical signals from one location (or device) to another. For example, a BGA connector can be used to send or receive signals between an integrated circuit die and an underlying printed circuit board. The BGA is electrically coupled to the various input and output pads of the integrated circuit. The BGA is also electrically coupled to landing pads on the printed circuit board, and the landing pads are in turn electrically coupled to a via. While there may be more details associated with the implementation of a BGA and vias, it is appreciated that those details are known in the art.

Currently, the conductive balls in a large format BGA are typically arranged with a pitch of approximately 1 millimeter (or about 40 mils). However, as the complexity and input/output (I/O) capability of integrated circuits grow, the number of conductive balls in a BGA will also need to grow commensurately, necessitating a reduction in pitch. Accordingly, a pitch on the order of 0.8 mm or perhaps even 0.65 mm may be required in order to accommodate the next generation of devices and beyond.

As the number of conductive balls increase and they become more densely packed, a problem is introduced regarding how to escape the footprint made by the BGA. That is, if there are a large number of conductive balls (perhaps on the order of 2000), and correspondingly a large number of traces coupled with the conductive balls, then it will become difficult to find room to route the traces on the printed circuit boards.

Consequently, the number of vias will also need to be increased, which in turn can introduce a number of other disadvantages. First, the increasing number of vias can consume a significant amount of the already limited space on the printed circuit boards, and so it is desirable to reduce the size of vias (that is, their diameter) if possible. Also, it is desirable to reduce the size of vias in order to accommodate the reduced pitch of, for example, a BGA. On the other hand, there are physical and practical limits which preclude formation of vias less than approximately 75 micrometers (microns) in diameter, using existing technology.

Accordingly, what is needed is a solution that can accommodate the increasing complexity of next-generation miniaturized devices such as integrated circuits without increasing, and preferably by decreasing, the amount of space consumed on circuit boards by vias. What is also needed is a solution that addresses the above needs and can reduce the difficulties associated with manufacturing smaller and smaller vias. The present invention provides a novel solution to the above needs.

These and other objects and advantages of the present invention will become obvious to those of ordinary skill in the art after having read the following detailed description of the preferred embodiments which are illustrated in the various drawing figures.

DISCLOSURE OF THE INVENTION

In one embodiment, the present invention pertains to a structure and method thereof for providing an electrically conductive path between a first conductive point and a second conductive point on adjacent layers separated by an insulating layer. The present invention can accommodate the increasing complexity of next-generation miniaturized devices such as integrated circuits without increasing the amount of space consumed on circuit boards by vias. In accordance with the present invention, the size (e.g., diameter) of the conductive path can be significantly reduced.

In the present embodiment of the present invention, the structure includes an insulating material disposed between the first conductive point and the second conductive point. A dipole material is homogeneously distributed within the insulating material. The dipole material is comprised of randomly oriented magnetic particles. During the manufacturing process, the magnetic dipoles in a selected localized region of the insulating material are aligned to form an electrically conductive path between the first conductive point and the second conductive point through the insulating material.

In one embodiment, the present invention is implemented in a multi-layered application comprised of a plurality of layers containing conductive paths. The insulating material is disposed between each layer and a neighboring layer. An electrically conductive path is formed through the insulating material between neighboring layers, as described above, or between non-neighboring layers.

In one embodiment, the layers are conductive layers (e.g., an integrated circuit substrate) that, with the insulating material, form a semiconductor package having alternating conductive layers and insulating layers. In one embodiment, connection to the semiconductor package is made through an array of attachment points (e.g., ball grid array, etc.).

Therefore, the present invention allows an electrically conductive path to be formed through an insulating material without the need for a drilled or photo-defined hole (e.g., a via) in the insulating material. For example, in a semiconductor package, the conductive path formed in accordance with the present invention can be significantly smaller than a via formed with existing technology, preserving valuable real estate in the semiconductor package and also allowing a denser array of input/output attachment points on the semiconductor package.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
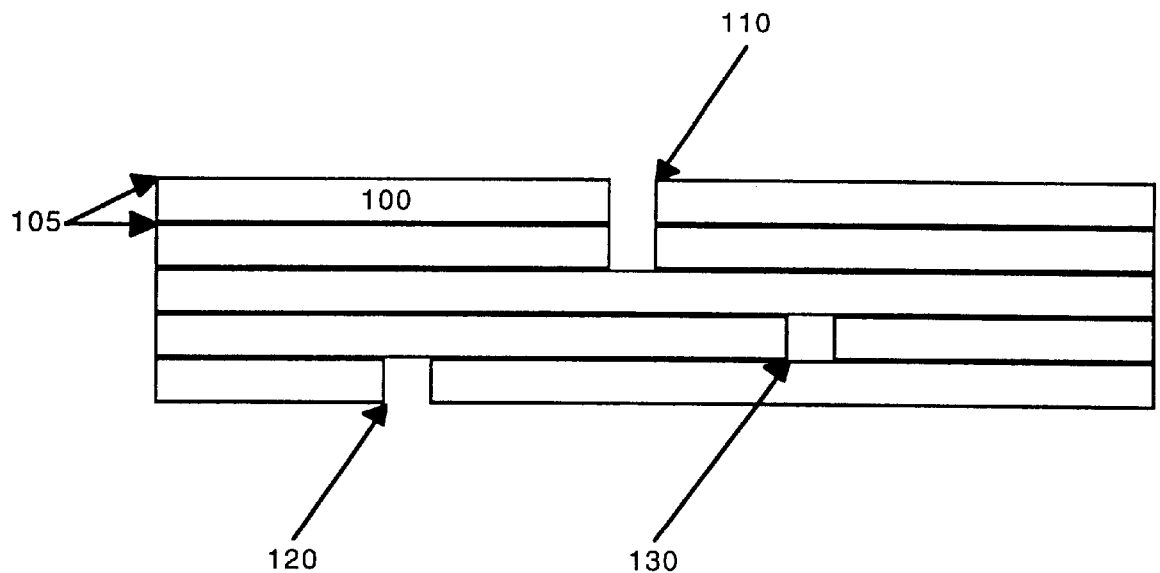
FIG. 1 is an illustration of vias implemented in a multi-layered device in accordance with the prior art.
Figure 2:
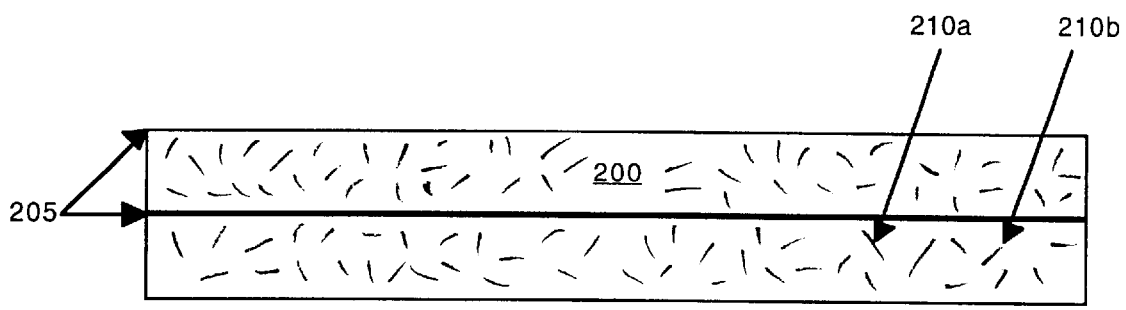
FIG. 2 illustrates an exemplary assembly comprised of a pair of conductive layers separated by a dielectric insulating material, upon which embodiments of the present invention can be implemented.

FIG. 2 illustrates an exemplary assembly 250 comprised of a pair of conductive layers 205 separated by a dielectric insulating material 200, upon which embodiments of the present invention may be practiced. Insulating material 200 can be any of the various insulating materials known in the art, such as plastic, resin, polymer, and the like. Residing in or on each conductive layer 205 is or can be one or more conductive paths (e.g., etched or photo-defined traces).

In one embodiment, layers 205 are comprised of printed circuit boards layered one on top of another and separated from neighboring circuit boards by insulating material 200; that is, in this embodiment, assembly 250 consists of alternating layers of circuit boards and insulating material. In another embodiment, layers 205 are comprised of conductive layers (e.g., metal layers, integrated circuit substrates, etc.) stacked one on top of another and separated by insulating material (e.g., to form a semiconductor package); that is, in this embodiment, assembly 250 consists of alternating layers of conductive layers and insulating layers. In one implementation of this embodiment, the semiconductor package is mounted on a ball grid array (BGA). It is appreciated that the present invention may be implemented in similarly configured multi-layered devices, in which each device in the multi-layered device is separated from neighboring devices by an insulating material. It is also appreciated that the present invention may be implemented in a multi-layered device having any number of layers. Furthermore, it is appreciated that the present invention may be implemented in multi-layered devices in which the different layers are of different shapes and in different arrangements; that is, layers 205 can be other than flat and arranged in other than a parallel, sandwich-type of arrangement.

In accordance with the present invention, insulating material 200 is doped with a dipole material containing randomly oriented magnetic particles (e.g., dipoles) typified by 210a and 210b. Because the magnetic particles are randomly oriented, they do not conduct electricity and so insulating material 200 continues to function as an insulator. In one embodiment, the dipole material is iron or a compound containing iron. Iron is a commonly used material in the semiconductor industry and therefore represents an understood quantity for this application.

In the present embodiment, the dipole material is relatively uniformly distributed through insulating material 200, although it is appreciated that it is not necessary for the distribution to be uniform. The dipole material can be added to insulating material 200 during the process in which insulating material 200 is manufactured. In accordance with the present invention, sufficient dipole material is added to insulating material 200 to allow a conductive path to be formed through insulating material 200 when the magnetic dipoles are appropriately aligned, as will be seen from the discussion below. Thus, in accordance with the present invention, a conductive path between conductive points can be accomplished without drilling holes (e.g., laser ablation or photo-definition to form vias).

Figure 3:
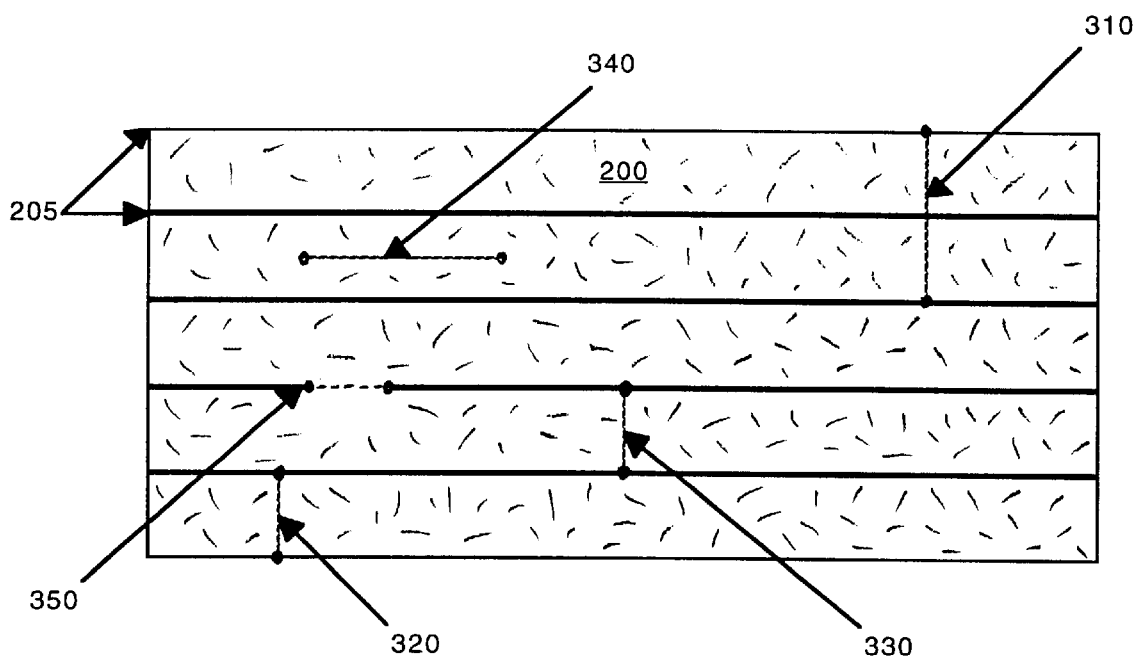
FIG. 3 illustrates an exemplary assembly incorporating conductive paths through insulating layers in accordance with one embodiment of the present invention.

With reference now to FIG. 3, at specific locations within insulating material 200, the magnetic particles are aligned (essentially, arranged end to end) in order to form a conductive path (e.g., conductive paths 310, 320 and 330) between conductive points through insulating material 200 in accordance with the present invention.

In the present embodiment, the aligned particles are localized in a small region, and the surrounding particles remain randomly oriented. The conductive path implemented in accordance with the present invention is smaller than the vias: used in the prior art. In accordance with the present invention, the conductive path formed by aligning magnetic particles can have a diameter on the order of two-to-three microns. The diameter of the conductive path formed in accordance with the present invention is also significantly reduced. Thus, the conductive paths formed in accordance with the present invention do not consume a significant amount of the limited space on, for example, a printed circuit board. Also, the conductive paths formed in accordance with the present invention can accommodate the reduced pitch of, for example, a BGA.

In one embodiment, after insulating material 200 is doped with the material containing the randomly oriented magnetic particles, the conductive path can be formed by first placing the insulating material in a magnetic field and then heating a localized (relatively small) region of insulating material 200 before it is disposed between layers 205. For example, a laser or an ion beam can be used to heat and therefore soften (e.g., plasticize) insulating material 200 in a very local region corresponding to a location in which a conductive path is desired. Once insulating material 200 is softened, the randomly oriented magnetic particles in the softened region are free to move within the localized region. Then, for example, the magnetic field that is applied to insulating material 200 causes the randomly oriented magnetic particles in the softened region to align themselves with the magnetic field. Once aligned, the magnetic particles form a conductive path through insulating material 200. The laser or ion beam can then be removed, allowing the softened region to reharden and thereby maintaining the magnetic particles in that region in the aligned position. This process can be repeated to form other conducting paths through insulating material 200. The process can be accomplished relatively quickly and may reduce the amount of time needed to form conductive paths relative to the current methods used to form vias. It is appreciated that other techniques can be used in accordance with the present invention to align the magnetic particles in an insulating material.

Continuing with reference to FIG. 3, in one embodiment of the present invention, conductive path 310 exemplifies an alignment of magnetic dipoles to form a conductive path between an external conductive layer of assembly 250 and an internal conductive layer through two layers of insulating material and another conductive layer. Conductive path 320 similarly exemplifies a conductive path between an external conductive layer and an internal conductive layer through an insulating layer. Conductive path 330 exemplifies a conductive path between two internal conductive layers through an insulating layer.

With reference still to FIG. 3, it is appreciated that aspects of the present invention may be used to form a conductive path between conductive points that lie, for, example, within the same insulating layer or on the same conductive layer but are separated by insulating material. Conductive path 340 exemplifies a conductive path between two conductive points in insulating layer 200. Conductive path 350 exemplifies a conductive path between to conductive points on the same conductive layer; in this application, the insulating material is disposed between the conductive points.

Figure 4:
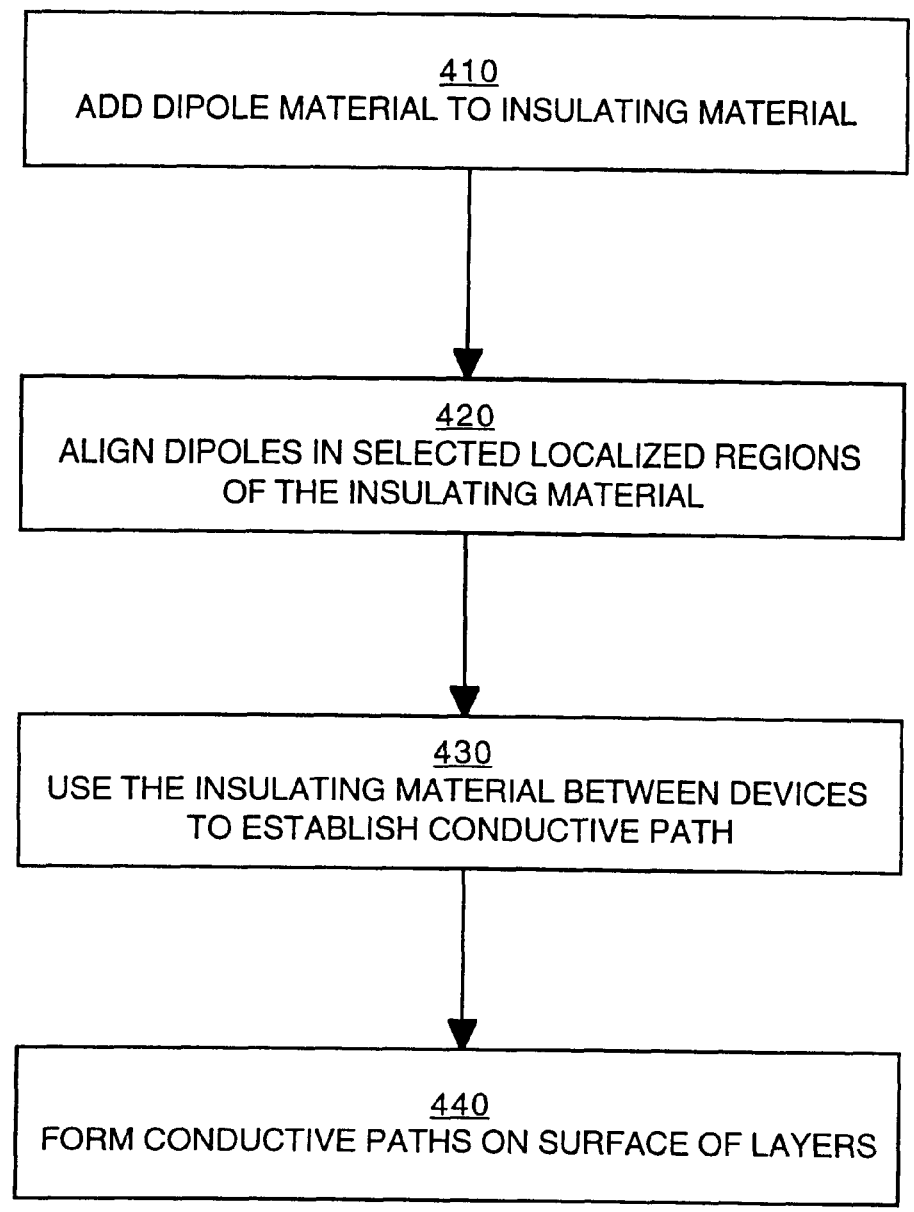
FIG. 4 is a flowchart of a process for providing a conductive path through an insulating material in accordance with one embodiment of the present invention.

FIG. 4 is a flowchart of process 400 for conducting electricity between two conductive points (e.g., electrical connectors residing on layers 205 of FIG. 2) through an insulating material (e.g., insulating material 200 of FIG. 2) in accordance with one embodiment of the present invention.

In step 410 of FIG. 4, a dipole material is added to insulating material 200 as described above in conjunction with FIGS. 2 and 3. The dipole material is comprised of randomly oriented magnetic particles, and thus insulating material 200 can continue to function as an insulator. In one embodiment, the dipole material is relatively uniformly distributed throughout insulating material 200, so that a conductive path can be formed through insulating material 20,0 at virtually any desired location. In one embodiment, the dipole material contains iron or a suitable iron alloy.

The dipole material can be added to insulating material 200 during the process in which insulating material 200 is manufactured. Sufficient dipole material can be added to insulating material 200 to allow a conductive path to be formed when the magnetic particles are appropriately aligned.

In step 420 of, FIG. 4, the magnetic particles are aligned in selected localized regions of insulating material 200. The locations selected for aligning magnetic particles correspond to those locations where a conductive path between two or more conductive points is desired. There are various and known design techniques for determining the locations where conductive paths are desired and for mapping those locations onto insulating material 200. Various techniques can be used to align the magnetic particles and form the conductive path; one such technique is described in conjunction with FIG. 3.

In the present embodiment, the aligned dipoles are localized in a small region, and the surrounding dipoles remain randomly oriented. Thus, the conductive path can be relatively small in diameter, and the material surrounding the conductive path can continue to function as an insulator.

In step 430 of FIG. 4, insulating material 200 containing the conductive paths (e.g., conductive paths 310, 320 and 330 of FIG. 3) is disposed between the conductive points (e.g., electrical connectors on layers 205) for which an electrical connection is desired. As described above, each conductive path is in a location specified during the design process so that it is aligned with an electrical connector (e.g., a conductive ball on a BGA, a gull wing lead, etc.) on each layer. Thus, the conductive path formed in accordance with the present invention can be used to carry electrical signals (such as address signals, data signals and control signals) between the conductive points on the layers, or to provide power or ground to the layers.

In step 440, conductive paths are formed on the surfaces of the layers. That is, the conductive points on a layer are connected by etched or photo-defined traces to other conductive points on the layer.

It is appreciated that the steps of process 400 can be implemented in a different order in accordance with the present invention. That is, for example, the conductive paths can be formed in insulating material 200 after assembly 250 (FIG. 2) is assembled.

In summary, the present invention pertains to a structure and method thereof for providing an electrically conductive path between a first conductive point and a second conductive point. In accordance with the present invention, the size (e.g., diameter and pitch) of the conductive path can be significantly reduced. The present invention allows an electrically conductive path to be formed through an insulating material without the need for a hole (e.g., a via) in the insulating material. For example, in a semiconductor package, the conductive path formed in accordance with the present invention can be significantly smaller than a via, preserving valuable real estate in the semiconductor package and also allowing a denser array of input/output attachment points on the semiconductor package. The present invention can thereby accommodate the increasing complexity of next-generation miniaturized devices such as integrated circuits without increasing the amount of space consumed on circuit boards by vias. In addition, the process for forming a conductive path in accordance with the present invention can reduce manufacturing time and cost.

The preferred embodiment of the present invention, an electrically conductive path through a dielectric material, is thus described. While the present invention has been described in particular embodiments, it should be appreciated that the present invention should not be construed as limited by such embodiments, but rather construed according to the following claims.

What is claimed is:

1. A structure for establishing a conductive path between a first conductive point and a second conductive point, said structure comprising:
    an insulating material disposed between said first conductive point and said second conductive point; and
    a dipole material uniformly distributed within said insulating material, said dipole material comprised of randomly oriented magnetic particles;
    wherein magnetic particles in a selected localized region of said insulating material are aligned to form an electrically conductive path between said first conductive point and said second conductive point through said insulating material, wherein magnetic particles outside of said selected localized region remain substantially randomly oriented and substantially uniformly distributed within said insulating material.

2. A structure for establishing a conductive path between a first conductive point and a second conductive point, said structure comprising:
    an insulating material disposed between said first conductive point and said second conductive point;
    a dipole material uniformly distributed within said insulating material, said dipole material comprised of randomly oriented magnetic particles;
    wherein magnetic particles in a selected localized region of said insulating material are aligned to form an electrically conductive path between said first conductive point and said second conductive point through said insulating material, wherein magnetic particles outside of said selected localized region remain randomly oriented and uniformly distributed within said insulating material; and
    a third conductive point disposed between said first conductive point and said second conductive point, wherein said insulating material is disposed between said first conductive point and said third conductive point and between said third conductive point and said second conductive point.

3. The structure of claim 2 wherein said first conductive point resides on a first conductive layer in a semiconductor package and said second conductive point resides on a second conductive layer in said semiconductor package.

4. The structure of claim 2 wherein said third conductive point resides on a third conductive layer in a semiconductor package.

5. The structure of claim 2 wherein said insulating material is a dielectric polymer.

6. The structure of claim 2 wherein said dipole material contains iron.

7. A semiconductor package comprising:
    a first conductive layer;
    an insulating layer comprised of an insulating material,
    a second conductive layer, wherein said insulating layer is disposed between said first conductive layer and said second conductive layer; and
    a dipole material uniformly distributed within said insulating material, said dipole material comprised of substantially randomly oriented magnetic particles;
    wherein magnetic particles in a selected localized region of said insulating material are concentrated and aligned from particles within the localized region to form an electrically conductive path between said first conductive layer and said second conductive layer through said insulating layer, wherein magnetic particles outside of said selected localized region remain substantially randomly oriented and substantially uniformly distributed within said insulating material.

8. The semiconductor package of claim 7 further comprising a third conductive layer disposed between said first conductive layer and said second conductive layer, wherein said insulating material is disposed between said first conductive layer and said third conductive layer and between said third conductive layer and said second conductive layer.

9. The semiconductor package of claim 7 wherein said insulating material is a dielectric polymer.

10. The semiconductor package of claim 7 wherein said dipole material contains iron.

11. The structure of claim 2 wherein said third conductive point resides on a third conductive layer in a semiconductor package.

12. The structure of claim 11 wherein said insulating material is a dielectric polymer.

13. The Structure of claim 12 wherein said dipole material contains iron.

14. The structure of claim 11 wherein said dipole material contains iron.

15. The structure of claim 2 wherein the first conductive layer includes at least one conductive trace and wherein the second conductive layer in includes at least one conductive trace.

16. The structure of claim 4 wherein the third conductive layer includes at least one conductive trace.

17. The structure of claim 3 wherein at least one of the first conductive point and the second conductive point are on an internal conductive layer.

18. The structure of claim 4 wherein at least one of the first conductive point, the second conductive point, and the third conductive point are on an internal conductive layer.

19. The structure of claim 4 wherein at least two of the first conductive point, the second conductive point, and the third conductive point are on an internal conductive layer.

20. A semiconductor package comprising:
    a first layer including a first conductive trace;
    a second layer including a second conductive trace; and
    an insulating layer disposed between the first layer and the second layer, the insulating layer including a plurality of separated magnetic particles, and localized regions wherein the magnetic particles in the insulating layer associated with the localized region are reoriented to form a conductive path between the first conductive trace and the second conductive trace.

21. The semiconductor package of claim 20 wherein the magnetic particles outside the conductive path between the first conductive trace and the second conductive trace are randomly oriented.

22. The semiconductor package of claim 20 wherein magnetic particles outside the conductive path between the first conductive trace and the second conductive trace are uniformly distributed within said insulating material.

23. The semiconductor package of claim 20 wherein said insulating material is a dielectric polymer.

24. The semiconductor package of claim 20 wherein the magnetic particles contain iron.

25. A semiconductor package comprising:
- a first layer including a first conductive trace;
- a second layer including a second conductive trace; and
- an insulating layer disposed between the first layer and the second layer, the insulating layer including a plurality of separated magnetic particles, wherein the magnetic particles in a selected localized region of the insulating layer are aligned form an electrically conductive path within the insulating layer to electrically connect the first trace and the second trace.

26. The semiconductor package of claim 25 wherein the magnetic particles outside the electrically conductive path between the first conductive trace and the second conductive trace are randomly oriented.

27. The semiconductor package of claim 25 wherein the magnetic particles outside the electrically conductive path between the first conductive trace and the second conductive trace are uniformly distributed within said insulating material.

28. A structure for establishing a conductive path between a first conductive point and a second conductive point, said structure comprising:
- an insulating material disposed between said first conductive point and said second conductive point; and
- a dipole material uniformly distributed within said insulating material, said dipole material comprised of uniformly oriented magnetic particles;
- wherein magnetic particles in a selected localized region of said insulating material are aligned to form an electrically conductive path between said first conductive point and said second conductive point through said insulating material, wherein magnetic particles outside of said selected localized region remain substantially uniformly oriented and substantially uniformly distributed within said insulating material.

* * * * *